(12) United States Patent
Kumar et al.

(10) Patent No.: US 8,125,267 B2
(45) Date of Patent: Feb. 28, 2012

(54) BIAS VOLTAGE GENERATION TO PROTECT INPUT/OUTPUT (IO) CIRCUITS DURING A FAILSAFE OPERATION AND A TOLERANT OPERATION

(75) Inventors: Pankaj Kumar, Bangalore (IN); Pramod E Parameswaran, Bangalore (IN); Makeshwar Kothandaraman, Whitehall, PA (US); Vani Deshpande, Bangalore (IN); John Kriz, Palmerton, PA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/889,440

(22) Filed: Sep. 24, 2010

(65) Prior Publication Data
US 2011/0102048 A1 May 5, 2011

Related U.S. Application Data

(63) Continuation of application No. 12/610,277, filed on Oct. 31, 2009.

(30) Foreign Application Priority Data

Jan. 29, 2010 (KR) ......................... 10-2010-0008659
Feb. 4, 2010 (EP) ...................................... 10152680

(51) Int. Cl.
*G05F 1/10* (2006.01)

(52) U.S. Cl. ........................................................ 327/543
(58) Field of Classification Search .................. 327/306, 327/543, 547
See application file for complete search history.

(56) References Cited

U.S. PATENT DOCUMENTS

| | | | | | |
|---|---|---|---|---|---|
| 5,666,082 | A | * | 9/1997 | Wilenken et al. | 327/404 |
| 6,114,901 | A | * | 9/2000 | Singh et al. | 327/543 |
| 6,333,663 | B1 | * | 12/2001 | Lee | 327/333 |
| 7,642,841 | B2 | * | 1/2010 | Jung et al. | 327/538 |

* cited by examiner

*Primary Examiner* — Hai L Nguyen
(74) *Attorney, Agent, or Firm* — Raj Abhyanker, P.C.

(57) ABSTRACT

A method includes controllably generating a first bias voltage from a supply voltage to be within an upper tolerable limit of an operating voltage of one or more constituent active circuit element(s) of an Input/Output (IO) core device of an integrated circuit (IC) to be interfaced with an IO pad, and controllably generating a second bias voltage from an external voltage supplied through the IO pad to be within the upper tolerable limit of the operating voltage of the one or more constituent active circuit element(s) of the IO core device to be interfaced with the IO pad. The method also includes controllably utilizing a control signal generated by the IO core to derive an output bias voltage from the first bias voltage during a driver mode of operation or the second bias voltage during a failsafe mode of operation and a tolerant mode of operation.

21 Claims, 11 Drawing Sheets

US 8,125,267 B2

BIAS VOLTAGE GENERATION TO PROTECT INPUT/OUTPUT (IO) CIRCUITS DURING A FAILSAFE OPERATION AND A TOLERANT OPERATION

PRIORITY CLAIM

This continuation application claims priority from the following Foreign applications:
1. China patent application number 201010000758.7 filed on Jan. 18, 2010
2. European patent application number 10152680.4 filed on Feb. 4, 2010
3. Japan patent application number 2010-043602 filed on Feb. 27, 2010
4. Korean patent application number 10-2010-0008659 filed on Jan. 29, 2010
5. Taiwan patent application number 99103684 filed on Feb. 6, 2010.

FIELD OF TECHNOLOGY

This disclosure relates generally to Input/Output (IO) circuits and, more particularly, to a method, an apparatus, and a system to generate a bias voltage to protect IO circuits during a failsafe operation and a tolerant operation.

BACKGROUND

An integrated circuit (IC) may include a constituent section that operates at a voltage different from another constituent section. Interfacing between constituent sections operating at different voltages may require a buffer circuit that may include active elements (e.g., Metal-Oxide-Semiconductor (MOS) transistors) operating at a voltage (e.g., 1.8 V) lower than a voltage across terminals thereof.

FIG. 1 shows a schematic view of an output stage 100 of a buffer circuit. The output stage 100 may include a p-channel Metal-Oxide-Semiconductor (PMOS) transistor $M_1$ 102 and an n-channel MOS (NMOS) transistor $M_2$ 104. The source (S) terminal of $M_1$ 102 may be connected to a supply voltage $V_{DDIO}$ 106, and the source (S) terminal of $M_2$ 104 may be connected to a supply voltage $V_{SS}$ 110. The bulk (B) terminals of the transistors ($M_1$ 102, $M_2$ 104) may be shorted with the source (S) terminals thereof to connect the bulk (B) terminals of the transistors ($M_1$ 102, $M_2$ 104) also to $V_{DDIO}$ 106 and $V_{SS}$ 110 respectively. The drain (D) terminals of $M_1$ 102 and $M_2$ 104 may be connected to one another, as shown in FIG. 1.

An external voltage from an Input/Output (IO) pad 108 of an IC may be supplied to each of the drain (D) terminals of $M_1$ 102 and $M_2$ 104. The gate (G) terminals of the transistors ($M_1$ 102, $M_2$ 104) may be driven by control signals (CTRL1 112 and CTRL2 114) generated from a control circuit of the buffer circuit. When the IO pad 108 voltage (e.g., 3.465 V) is higher than the supply voltage, $V_{DDIO}$ 106 (e.g., 1.8 V, 2.5 V), the parasitic diode $D_1$ 116, shown in FIG. 1 as being associated with $M_1$ 102, may be turned ON, leading to there being a direct path between the IO pad 108 voltage and the supply voltage $V_{DDIO}$ 106. The turning ON of $D_1$ 116 may lead to the conducting of a large current, which, in turn, may cause large leakage currents to flow. FIG. 1 also shows the parasitic diode $D_2$ 118 associated with $Q_2$ 104.

A high value of the IO pad 108 voltage may, therefore, compromise the reliability of the buffer circuit.

SUMMARY

Disclosed are a method, an apparatus, and a system to generate a bias voltage to protect Input/Output (IO) circuits during a failsafe operation and a tolerant operation.

In one aspect, a method includes controllably generating a first bias voltage from a supply voltage to be within an upper tolerable limit of an operating voltage of one or more constituent active circuit element(s) of an Input/Output (IO) core device of an integrated circuit (IC) to be interfaced with an IO pad, and controllably generating a second bias voltage from an external voltage supplied through the IO pad to be within the upper tolerable limit of the operating voltage of the one or more constituent active circuit element(s) of the IO core device to be interfaced with the IO pad. The method also includes controllably utilizing a control signal generated by the IO core to derive an output bias voltage from the first bias voltage during a driver mode of operation or the second bias voltage during a failsafe mode of operation and a tolerant mode of operation.

The external voltage supplied through the IO pad varies from zero to a value of the supply voltage during the driver mode of operation. The supply voltage is zero during the failsafe mode of operation, and the external voltage supplied through the IO pad increases to a value above the supply voltage during the tolerant mode of operation.

In another aspect, a bias voltage generating circuit includes a multiplexer block configured to receive a first bias voltage controllably generated from a supply voltage to be within an upper tolerable limit of an operating voltage of one or more constituent active circuit element(s) of an IO core device of an IC to be interfaced with an IO pad, and to receive a second bias voltage controllably generated from an external voltage supplied through the IO pad to be within the upper tolerable limit of the operating voltage of the one or more constituent active circuit element (s) of the IO core device to be interfaced with the IO pad. The multiplexer block is also configured to derive an output bias voltage from the first bias voltage during a driver mode of operation or the second bias voltage during a failsafe mode of operation and a tolerant mode of operation through a controllable utilization of a control signal generated by the IO core.

The external voltage supplied through the IO pad varies from zero to a value of the supply voltage during the driver mode of operation. The supply voltage is zero during the failsafe mode of operation, and the external voltage supplied through the IO pad increases to a value above the supply voltage during the tolerant mode of operation.

In yet another aspect, an Input/Output (IO) includes an IO core-end block to generate a control signal, a driver block to drive one or more external active circuit element(s), an IO pad interfaced with the driver block, and a bias voltage generating circuit. The IO core-end block includes one or more constituent active circuit element(s) having an upper tolerable limit of an operating voltage thereof. The bias voltage generating circuit is configured to receive a supply voltage, to receive an external voltage supplied through the IO pad, and to generate an output bias voltage within the upper tolerable limit of the operating voltage of one or more constituent active circuit element(s) of the IO core-end block.

The bias voltage generating circuit includes a multiplexer block configured to receive a first bias voltage controllably generated from the supply voltage to be within the upper tolerable limit of the operating voltage of the one or more constituent active circuit element(s) of the IO core-end block to be interfaced with the IO pad, and to receive a second bias voltage controllably generated from the external voltage supplied through the IO pad to be within the upper tolerable limit of the operating voltage of the one or more constituent active circuit element(s) of the IO core-end block to be interfaced with the IO pad. The bias voltage generating circuit is also configured to derive the output bias voltage from the first bias voltage during a driver mode of operation or the second bias voltage during a failsafe mode of operation and a tolerant mode of operation through a controllable utilization of the control signal generated by the IO core-end block.

The external voltage supplied through the IO pad varies from zero to a value of the supply voltage during the driver mode of operation. The supply voltage is zero during the failsafe mode of operation, and the external voltage supplied through the IO pad increases to a value above the supply voltage during the tolerant mode of operation.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to generate a bias voltage to protect Input/Output (IO) circuits during a failsafe operation and a tolerant operation. Although the present embodiments have been described with reference to specific example embodiments, it will be evident that various modifications and changes may be made to these embodiments without departing from the broader spirit and scope of the various embodiments.

Figure 1:
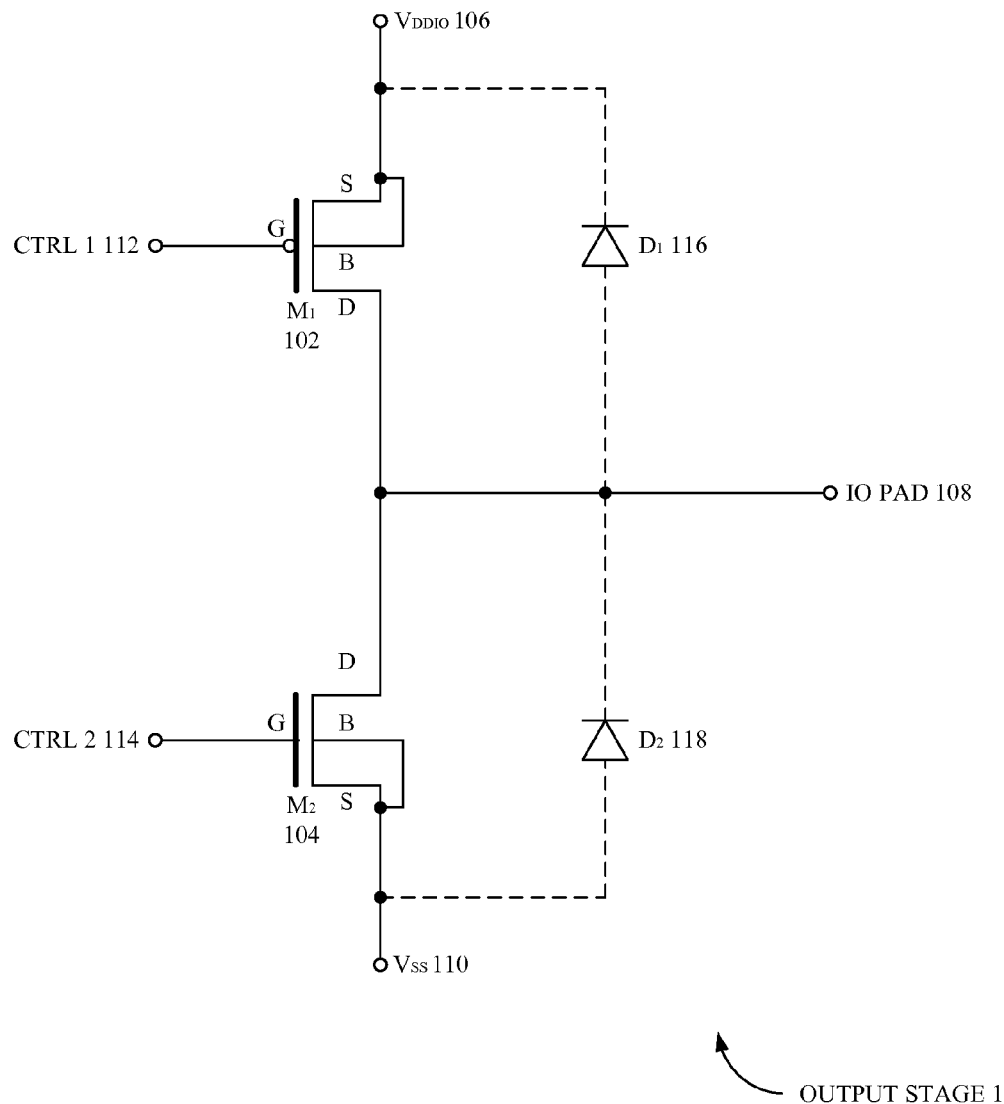
FIG. 1 shows a schematic view of an output stage of a buffer circuit.
Figure 2:
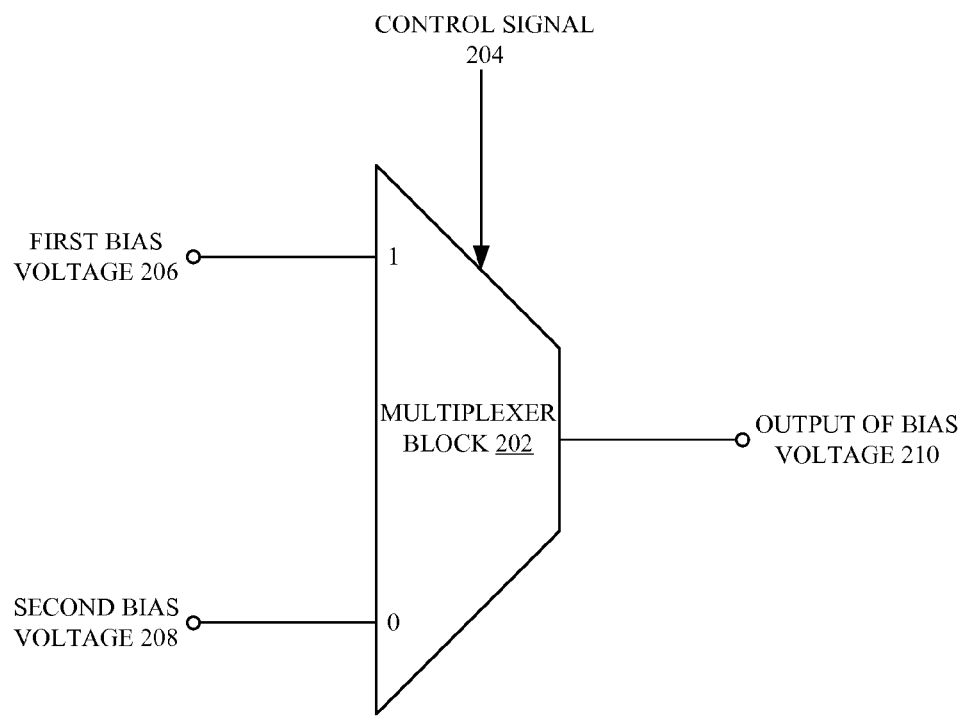
FIG. 2 is a schematic view of a multiplexer circuit, according to one or more embodiments.

FIG. 2 shows a multiplexer circuit 200, according to one or more embodiments. In one or more embodiments, the multiplexer circuit 200 includes a multiplexer block 202 that may receive a first bias voltage 206 and a second bias voltage 208 as the inputs. In one or more embodiments, the first bias voltage 206 may be controllably generated from a supply voltage (not shown in FIG. 2), and the second bias voltage 208 may be controllably generated from an external voltage supplied through an Input/Output (IO) pad (not shown in FIG. 2). In one or more embodiments, the first bias voltage 206 and the second bias voltage 208 may be within an upper tolerable limit of an operating voltage of one or more constituent active circuit element(s) (e.g., Metal-Oxide-Semiconductor (MOS) transistor) of an IO core device of an integrated circuit (IC) to be interfaced with the IO pad.

In one or more embodiments, the output of the multiplexer block 202, shown as the output bias voltage 210 in FIG. 2, may be derived from the first bias voltage 206 during a driver mode of operation, where the external voltage supplied through the IO pad may vary from zero to a value of the supply voltage, or from the second bias voltage 208 during a failsafe mode of operation and a tolerant mode of operation. In one or more embodiments, the supply voltage may be zero during the failsafe mode of operation, and the external voltage supplied through the IO pad may increase to a value above the supply voltage during the tolerant mode of operation.

In other words, as shown in FIG. 2, the output of the multiplexer block 210 may be based on a "high" or "low" state of a control signal 204 (e.g., Output Enable (OE)). The "high" state of the control signal 204, which is a logic "1," may indicate the presence of the supply voltage. The "low" state of the control signal 204, which is a logic "0," may indicate the absence of the supply voltage or the tolerant case, where the external voltage supplied through the IO pad may increase to a value above the supply voltage. Therefore, during the "low" state of the control signal 204, the supply voltage may or may not be present. In one or more embodiments, the control signal 204 may be generated by the IO core.

In one or more embodiments, the control signal 204 may be utilized in a controllable manner to derive the output bias voltage 210. Therefore, the output bias voltage 210 may be derived from the first bias voltage 206 during the driver mode of operation when the state of the control signal 204 is "high," or the second bias voltage 208 during the failsafe mode of operation and the tolerant mode of operation when the state of the control signal 204 is "low."

In one or more embodiments, the first bias voltage 206 may be controllably generated as a fraction of the supply voltage. In one or more embodiments, the second bias voltage 208 may be controllably generated as the external voltage supplied through the IO pad reduced by a threshold voltage of one or more active element(s) (e.g., Metal-Oxide-Semiconductor (MOS) transistors).

Figure 3:
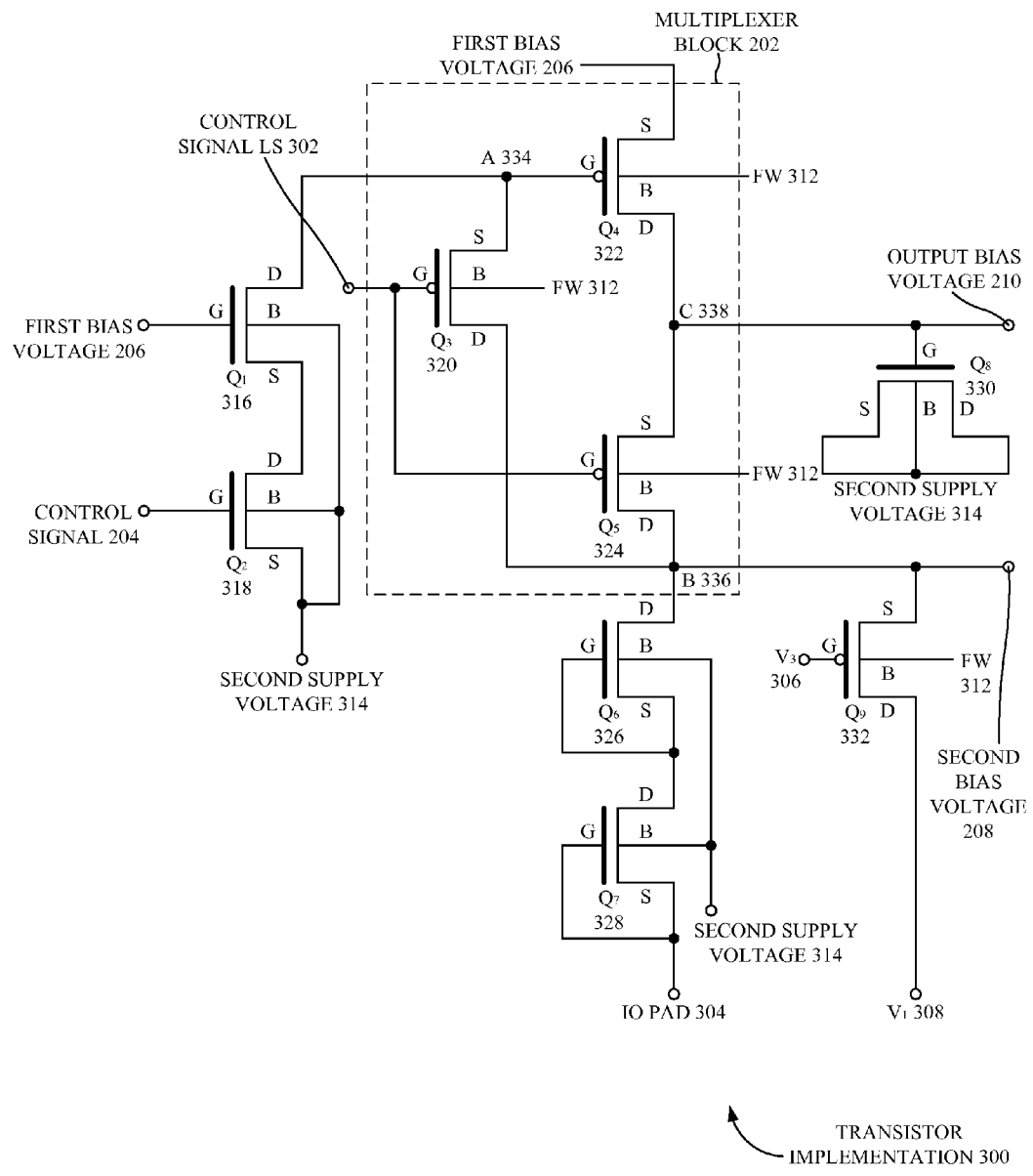
FIG. 3 is a schematic view of a transistor implementation of the multiplexer circuit of FIG. 2, according to one or more embodiments.

FIG. 3 shows a transistor implementation 300 of the multiplexer circuit 200 of FIG. 2, according to one or more embodiments. It is obvious to one of ordinary skill in the art that the source (S) and drain (S) terminals of a MOS transistor are interchangeable and, therefore, coupling a voltage to the source (S) terminal and outputting another voltage from the drain (D) terminal is equivalent to coupling the voltage to the drain (D) terminal and outputting another voltage from the source (S) terminal. A drain-drain (D-D) path may also be equivalent to a source-drain (S-D) path.

In one or more embodiments, the multiplexer block 202 includes a first MOS transistor $Q_4$ 322 configured to receive the first bias voltage 206 at the source (S) terminal thereof, and a pair of MOS transistors ($Q_3$ 320 and $Q_5$ 324) configured to receive a controllable level shifted version of the control signal 204 (control signal LS 302) at gate (G) terminals thereof. In one or more embodiments, control signal LS 302 may be at a fraction of the supply voltage, $V_{DDIO}$ (not shown in FIG. 3), during each of the driver mode of operation and the tolerant mode of operation. In one or more embodiments, during the driver mode of operation, control signal LS 302 may be at a value higher (e.g., $0.6\,V_{DDIO}$) than the value of control signal LS 302 (e.g., $0.1\,V_{DDIO}$) during the tolerant mode of operation. In one or more embodiments, control signal LS 302 may be zero when the supply voltage ($V_{DDIO}$) is zero during the failsafe mode of operation.

Therefore, in one or more embodiments, control signal LS 302 may switch between $0.6\,V_{DDIO}$ during the driver mode of operation and $0.1\,V_{DDIO}$ during the tolerant mode of operation, depending on whether the control signal 204 represents a logic "1" or logic "0." However, as shown in FIG. 2, logic "0" may also represent the failsafe mode of operation, where control signal LS 302 is zero. Therefore, the two states of the control signal 204 may be better described as a logic "high" (during the driver mode of operation) and a logic "low" (during the tolerant mode of operation and the failsafe mode of operation).

In one or more embodiments, the drain (D) terminal of $Q_3$ 320 may be coupled to the drain (D) terminal of $Q_5$ 324. In one or more embodiments, the source (S) terminals of $Q_3$ 320 and $Q_5$ 324 may be coupled to the gate (G) terminal and the drain (D) terminal of $Q_4$ 322 respectively. In one or more embodiments, $Q_5$ 324 may be configured to receive the second bias voltage 208 at the drain (D) terminal thereof. In one or more embodiments, the drain (D) terminals of $Q_3$ 320 and $Q_5$ 324 may be coupled to one another. In one or more embodiments, $Q_3$ 320, $Q_4$ 322 and $Q_5$ 324 may be p-channel MOS (PMOS) transistors. In one or more embodiments, the output of the multiplexer block 202, the output bias voltage 210, may be taken at the drain-source (D-S) path between $Q_4$ 322 and $Q_5$ 324 (node C 338).

In one or more embodiments, the control signal 204 and the first bias voltage 206 may be applied at the gate (G) terminals of MOS transistors $Q_2$ 318 and $Q_1$ 316 respectively. In one or more embodiments, the source (S) terminal of $Q_1$ 316 may be coupled to the drain (D) terminal of $Q_2$ 318, and the drain (D) terminal of $Q_1$ 316 may be coupled to the gate (G) terminal of $Q_4$ 322. In one or more embodiments, the bulk (B) terminals of $Q_1$ 316 and $Q_2$ 318, and the source (S) terminal of $Q_2$ 318 may be held at a second supply voltage 314 ($V_{SS}$). In one or more embodiments, $Q_1$ 316 and $Q_2$ 318 may be pass transistors (shown in FIG. 3 as NMOS transistors) configured to enable node A 334 to be discharged when $Q_1$ 316 and $Q_2$ 318 are switched ON during a logic "high" of the control signal 204. In one or more embodiments, the first bias voltage 206 may be a fraction of the supply voltage $V_{DDIO}$ (e.g., $0.55\,V_{DDIO}$).

In one or more embodiments, a pair of MOS transistors ($Q_6$ 326 and $Q_7$ 328) may be provided in the transistor implementation 300 of the multiplexer circuit 200 of FIG. 2 to reduce the external voltage supplied through the IO pad (IO pad 304 voltage) by the threshold voltages of $Q_6$ 326 and $Q_7$ 328. Therefore, at node B 336, the second bias voltage 208 may be expressed as Example Equation 1.

$$V_{SB} = IO_{PAD} - 2V_{tn}, \quad (1)$$

where $V_{SB}$ is the second bias voltage 208, $IO_{PAD}$ is the IO pad 304 voltage, and $V_{tn}$ is the threshold voltage of each of $Q_6$ 326 and $Q_7$ 328. FIG. 3 shows $Q_6$ 326 and $Q_7$ 328 as n-channel MOS (NMOS) transistors, where the source (S) terminal of $Q_6$ 326 may be coupled to the drain (D) terminal of $Q_7$ 328. In one or more embodiments, IO pad 304 voltage may be applied at the source (S) terminal and the gate (G) terminal of $Q_7$ 328. In one or more embodiments, the gate (G) terminal of $Q_6$ 326 may be coupled to the source (S) terminal thereof. In one or more embodiments, the bulk (B) terminals of $Q_6$ 326 and $Q_7$ 328 may be held at the second supply voltage 314 ($V_{SS}$). One skilled in the art will appreciate that the number of active elements (e.g., MOS transistors $Q_6$ 326 and $Q_7$ 328) provided to reduce the IO pad 304 voltage may vary, and that such a variation is within the scope of the exemplary embodiments.

In one or more embodiments, the second bias voltage 208 may, thus, be within an upper tolerable limit of one or more constituent active circuit element(s) (e.g., MOS transistors) of an IO core device of an IC to be interfaced with the IO pad. In one or more embodiments, in order to generate an output bias voltage 210 in and around the upper tolerance limit of the aforementioned constituent active circuit elements of the IO core device, a MOS transistor $Q_9$ 332, whose gate (G) terminal and the drain (D) terminal are configured to receive controllable input voltages ($V_3$ 306 and $V_1$ 308 respectively), may be provided. In one or more embodiments, the source (S) terminal of $Q_9$ 332, shown in FIG. 3 as an NMOS transistor, may be coupled to node B 336. In one or more embodiments, $V_3$ 306 and $V_1$ 308 may be controlled to be fractions of the supply voltage $V_{DDIO}$. For example $V_3$ 306 may be equal to $0.3\,V_{DDIO}$ and $V_1$ 308 may be equal to $0.1\,V_{DDIO}$.

In one or more embodiments, when supply voltage $V_{DDIO}$ is zero during the failsafe mode of operation, $Q_9$ 332 may pull maximum current to maximize the diode drops across $Q_6$ 326 and $Q_7$ 328. In one or more embodiments, when the supply voltage is present during the driver mode of operation and the tolerant mode of operation, $Q_9$ 332 may pull a current that is less compared to the current during the failsafe mode of operation. In one or more embodiments, the diode drops across $Q_6$ 326 and $Q_7$ 328 may, therefore, decrease.

In one or more embodiments, the bulk (B) terminals of $Q_3$ 320, $Q_4$ 322, $Q_5$ 324, and $Q_9$ 332 may be coupled to the output of a floating well (FW) circuit to avoid the forward biasing of parasitic diodes associated with the aforementioned transistors.

In one or more embodiments, during the driver mode of operation, i.e., when the control signal 204 (e.g., OE) is a logic "high" and the supply voltage $V_{DDIO}$ (e.g., 2.5 V) is present, the first bias voltage 206 may be appropriately scaled to a fraction of $V_{DDIO}$ (e.g., $0.55\,V_{DDIO}$). In one or more embodiments, control signal LS 302 may also be adjusted appropriately to a fraction of $V_{DDIO}$. For example, the logic "high" of the control signal 204 may indicate a control signal LS 302 value of $0.6\,V_{DDIO}$. In one or more embodiments, pass transistors $Q_1$ 316 and $Q_2$ 318 may be turned ON, thereby enabling node A 334 to be discharged. In one or more embodiments, the discharging of node A 334 may switch $Q_4$ 322 ON, and the adjusted "high" level of control signal LS 302 (e.g., $0.6\,V_{DDIO}$) may keep $Q_3$ 320 and $Q_5$ 324 switched OFF. In one or more embodiments, any perturbation at the node B 336 may not affect the output at node C 338, i.e., the output bias voltage 210. In one or more embodiments, the output bias voltage 210 may faithfully track the first bias voltage 206, and may be equal to the first bias voltage 206.

In one or more embodiments, during the failsafe mode of operation, i.e., when the control signal 204 is a logic "low" and the supply voltage $V_{DDIO}$ is zero, the first bias voltage 206 and control signal LS 302 may also be zero. Therefore, in one or more embodiments, node A 334 may not be able to discharge through the $Q_1$ 316-$Q_2$ 318 path. When the IO pad 304 voltage increases, $Q_6$ 326 and $Q_7$ 328 may be turned ON, thereby enabling the second bias voltage 208 to track the IO pad 304 voltage as per example Equation 1. In one or more embodiments, the logic "low" of control signal LS 302 may cause $Q_3$ 320 and $Q_5$ 324 to be turned ON, which may charge node A 334. In one or more embodiments, the charging of node A 334 may turn $Q_4$ 322 OFF. In one or more embodiments, as $Q_5$ 324 may be ON, the output bias voltage 210 may track the second bias voltage 208.

In one or more embodiments, a decoupling capacitor $Q_8$ 330 may be used at node C 338 to mitigate the effects of capacitive noise on the output bias voltage 210, which may be coupled to the gate (G) terminal of a MOS transistor of a driver of the IO pad, during switching of the IO pad 304 voltage. In one or more embodiments, $Q_8$ 330 may be a NMOS capacitor, where the output bias voltage 210 is coupled to the gate (G) terminal thereof. In one or more embodiments, the gate (G), bulk (B), and drain (D) terminals of $Q_g$ 330 may all be held at the second supply voltage 310 ($V_{SS}$) level.

In one or more embodiments, during the tolerant mode of operation, i.e., when the control signal 204 is a logic "low" and the supply voltage $V_{DDIO}$ is present, control signal LS 302 may switch to a fraction of the supply voltage $V_{DDIO}$ that is lower than the value thereof during the driver mode of operation. For example, control signal LS 302 may switch to 0.1 $V_{DDIO}$, which still may represent the logic "low." In one or more embodiments, when IO pad 304 voltage is low, $Q_6$ 326 and $Q_7$ 328 may be OFF, along with $Q_2$ 318. Therefore, in one or more embodiments, node A 334 may not have a path to discharge, except for through $Q_4$ 322. In one or more embodiments, the discharging of node A 334 may cause the output bias voltage 210 to settle close to the first bias voltage 206 of $Q_4$ 322 through leakage current thereof.

In one or more embodiments, the tolerant mode of operation may be analogous to the driver mode of operation when the IO pad 304 voltage is low. Here, the two cases have differing control signal LS 302 values (0.6 $V_{DDIO}$ and 0.1 $V_{DDIO}$ respectively) to differentiate between the tolerant mode of operation and the driver mode of operation, when the IO pad 304 voltage increases to a value above the supply voltage $V_{DDIO}$.

In one or more embodiments, when the IO pad 304 voltage increases, $Q_6$ 326 and $Q_7$ 328 may be turned ON, thereby enabling the second bias voltage 208 to track the IO pad 304 voltage as per example Equation 1. In one or more embodiments, the logic "low" of control signal LS 302 may cause $Q_3$ 320 and $Q_5$ 324 to be turned ON, which may charge node A 334. In one or more embodiments, the charging of node A 334 may turn $Q_4$ 322 OFF. In one or more embodiments, as $Q_5$ 324 may be ON, the output bias voltage 210 may track the second bias voltage 208.

In one example embodiment, the supply voltage $V_{DDIO}$ may be 2.75 V (2.5V+10% tolerance), IO pad 304 voltage may be 3.465 V (3.3 V+5% tolerance), and the operating voltage of one or more constituent active circuit element(s) of the IO core device may be 1.98 V (1.8 V+10% tolerance). In such a case, the first bias voltage 206, the second bias voltage 208, and the output bias voltage 210 may all be within 1.98 V. Additionally, the first bias voltage 206 and the second bias voltage 208 being within 1.98 V may facilitate reliable operation of constituent MOS transistors of the multiplexer circuit 200.

Figure 4:
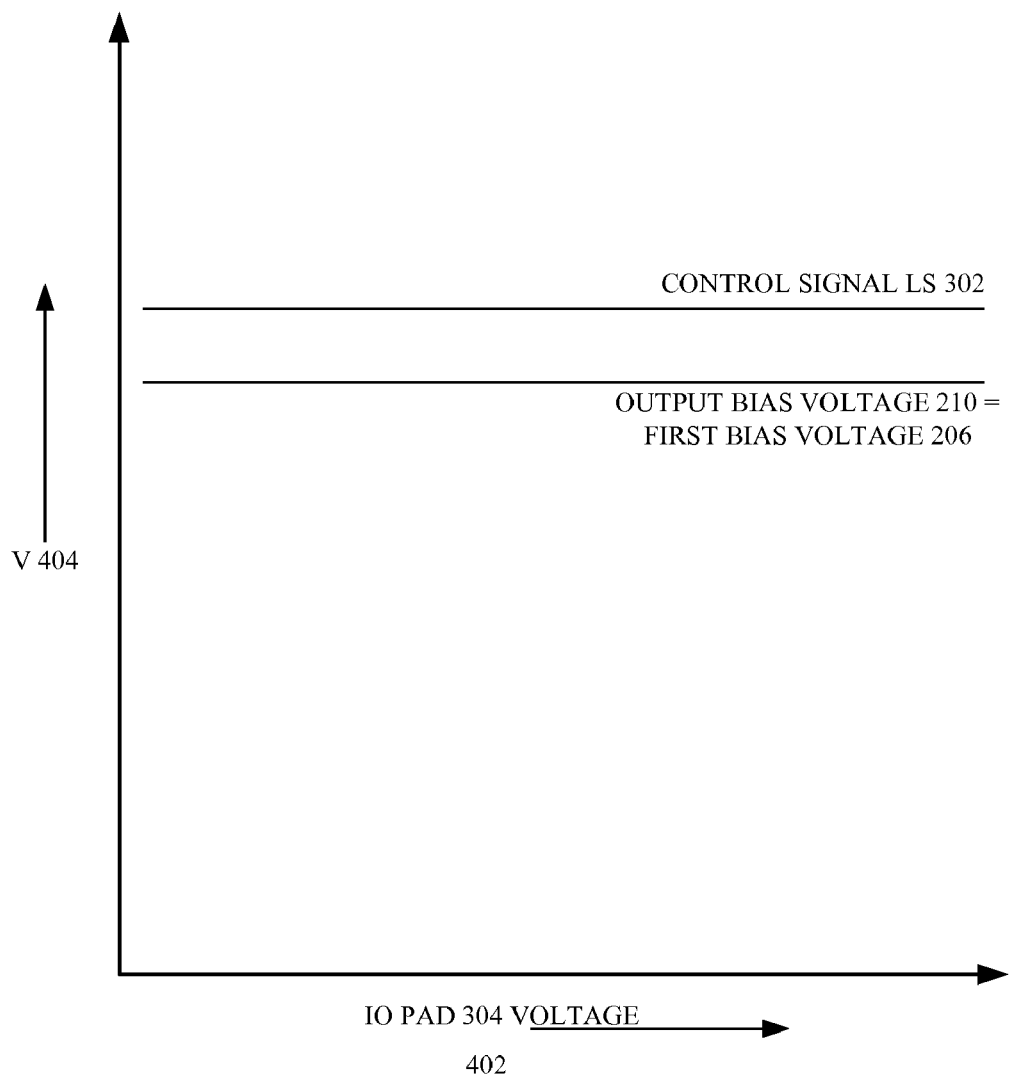
FIG. 4 is a plot of the DC characteristics of the transistor implementation of the multiplexer circuit of FIG. 2 during a driver mode of operation, according to one or more embodiments.

FIG. 4 shows the DC characteristics of the transistor implementation 300 of the multiplexer circuit 200 of FIG. 2 during the driver mode of operation, according to one or more embodiments. In one or more embodiments, the x-axis 402 may represent IO pad 304 voltage and the y-axis 404 may represent a voltage variable (V). In one or more embodiments, as shown in FIG. 4, the output bias voltage 210 may be equal to the first bias voltage 206 during all values of IO pad 304 voltage. In one or more embodiments, control signal LS 302 and the first bias voltage 206 may be a fraction of the supply voltage $V_{DDIO}$ (e.g., 0.6 $V_{DDIO}$) during the driver mode of operation (e.g., 0.6 $V_{DDIO}$ and 0.55 $V_{DDIO}$ respectively).

Figure 5:
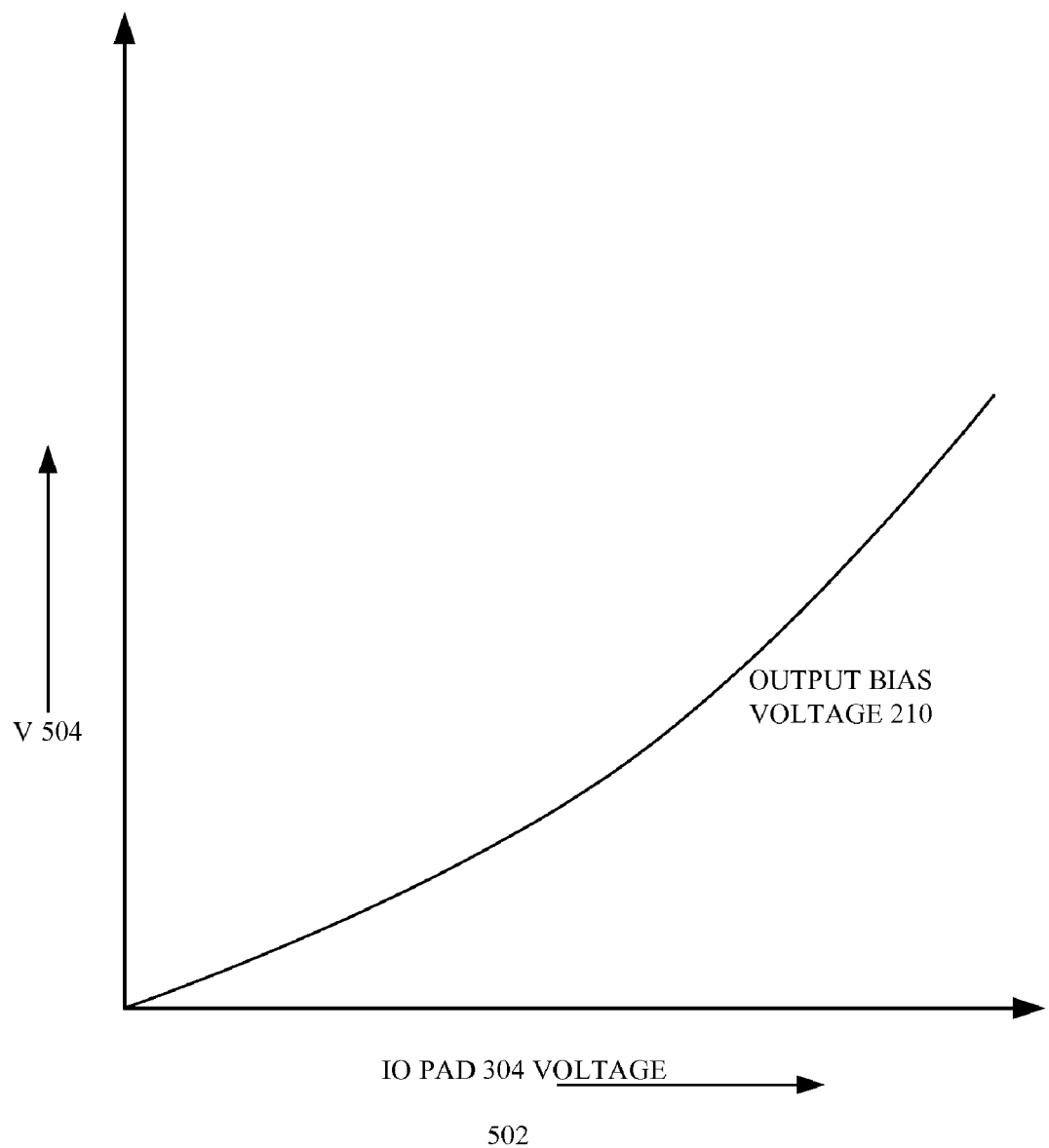
FIG. 5 is a plot of the DC characteristics of the transistor implementation of the multiplexer circuit of FIG. 2 during a failsafe mode of operation, according to one or more embodiments.

FIG. 5 shows the DC characteristics of the transistor implementation 300 of the multiplexer circuit 200 of FIG. 2 during the failsafe mode of operation, according to one or more embodiments. In one or more embodiments, the x-axis 502 may refer to the IO pad 304 voltage and the y-axis 504 may be a voltage variable (V). In one or more embodiments, the supply voltage $V_{DDIO}$ may be zero during the failsafe mode of operation. In one or more embodiments, the output bias voltage 210 may track the second bias voltage 208, as shown in FIG. 5. In other words, the output bias voltage 210 may increase with the increase in IO pad 304 voltage.

Figure 6:
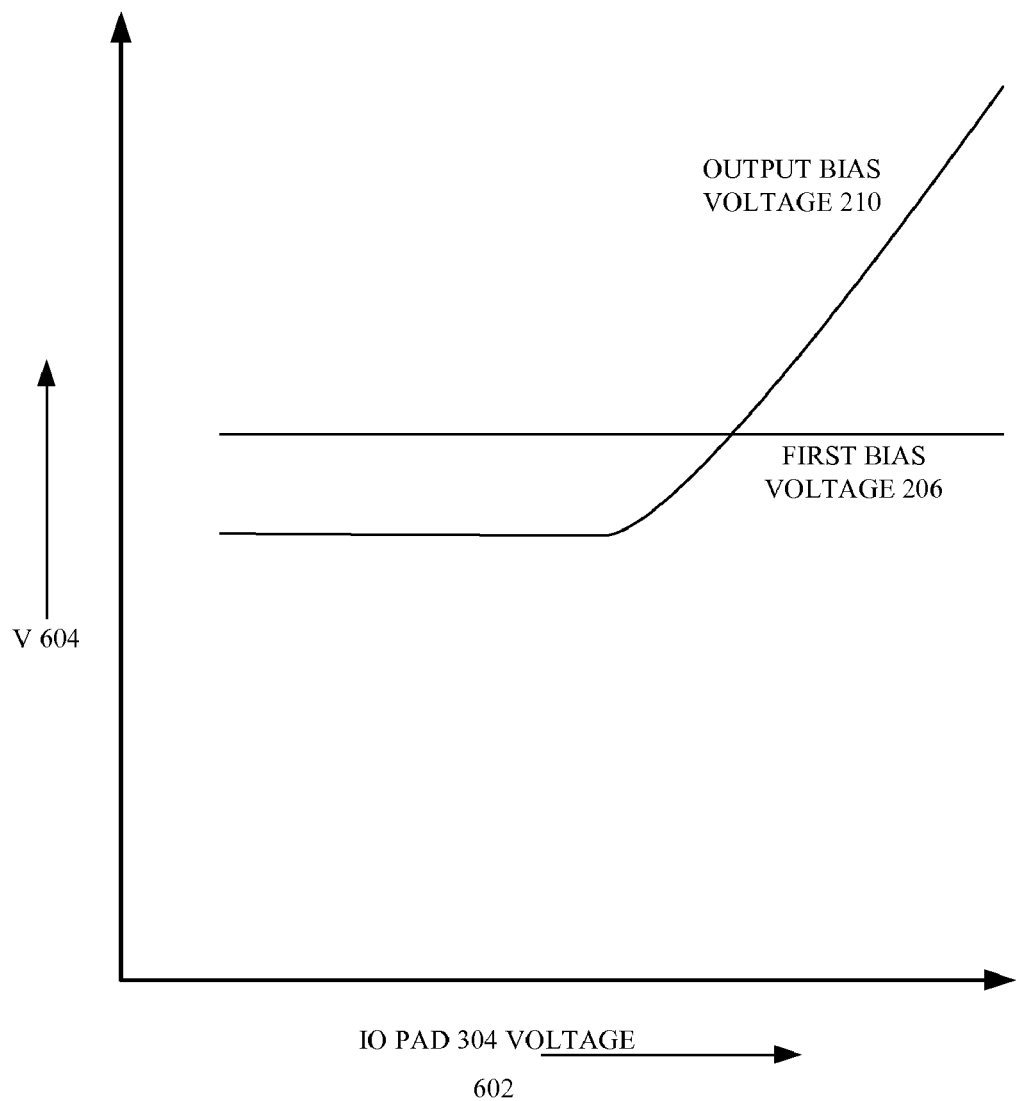
FIG. 6 is a plot of the DC characteristics of the transistor implementation of the multiplexer circuit of FIG. 2 during a tolerant mode of operation, according to one or more embodiments.

FIG. 6 shows the DC characteristics of the transistor implementation 300 of the multiplexer circuit 200 of FIG. 2 during the tolerant mode of operation, according to one or more embodiments. In one or more embodiments, the x-axis 602 may refer to the IO pad 304 voltage and the y-axis 604 may refer to a voltage variable (V). In one or more embodiments, the supply voltage $V_{DDIO}$ may be present during the tolerant mode of operation, and control signal LS 302 may be at a logic "low" (e.g., 0.1 $V_{DDIO}$). In one or more embodiments, as shown in FIG. 6 and as discussed above, the output bias voltage 210 may settle close to the first bias voltage 206 when the IO pad 304 voltage is low. In one or more embodiments, when the IO pad 304 voltage increases, $Q_6$ 326 and $Q_7$ 328 may turn ON, and the output bias voltage 210 may start tracking the second bias voltage 208.

Figure 7:
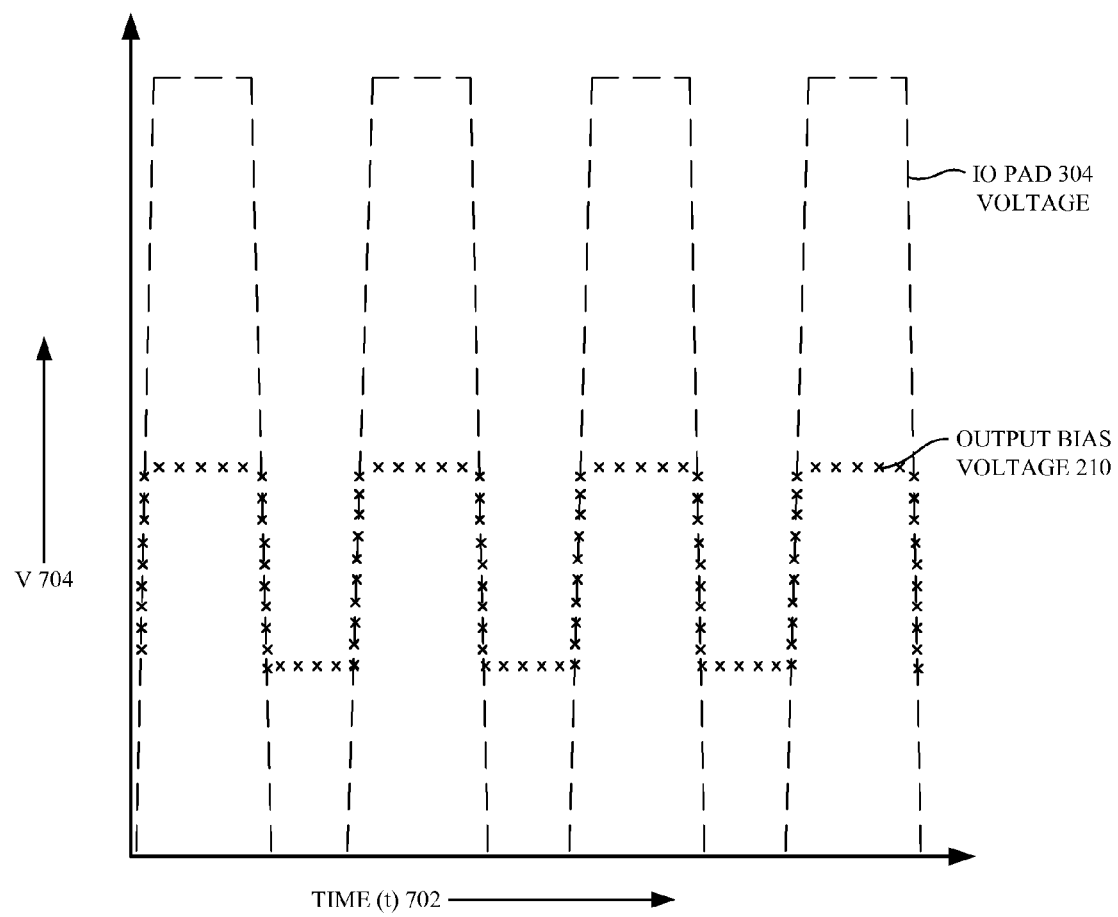
FIG. 7 is a plot of the transient characteristics of the transistor implementation of the multiplexer circuit of FIG. 2 during the failsafe mode of operation, according to one or more embodiments.

FIG. 7 shows the transient characteristics of the transistor implementation 300 of the multiplexer circuit 200 of FIG. 2 during the failsafe mode of operation, according to one or more embodiments. In one or more embodiments, the x-axis 702 may refer to time (t) and the y-axis 704 may refer to a voltage variable (V). In one or more embodiments, as the IO pad 304 voltage switches from 0 to a maximum value thereof (e.g., 3.465 V) and from the maximum value to 0, the output bias voltage 210 may switch from a low value (i.e., threshold voltage of $Q_4$ 322) to approximately the second bias voltage 208 and the second bias voltage 208 to the low value, as shown in FIG. 7. In one or more embodiments, the output bias voltage 210 may be clamped to the threshold voltage of $Q_4$ 322 as there is no discharge path for node A 334 otherwise.

Figure 8:
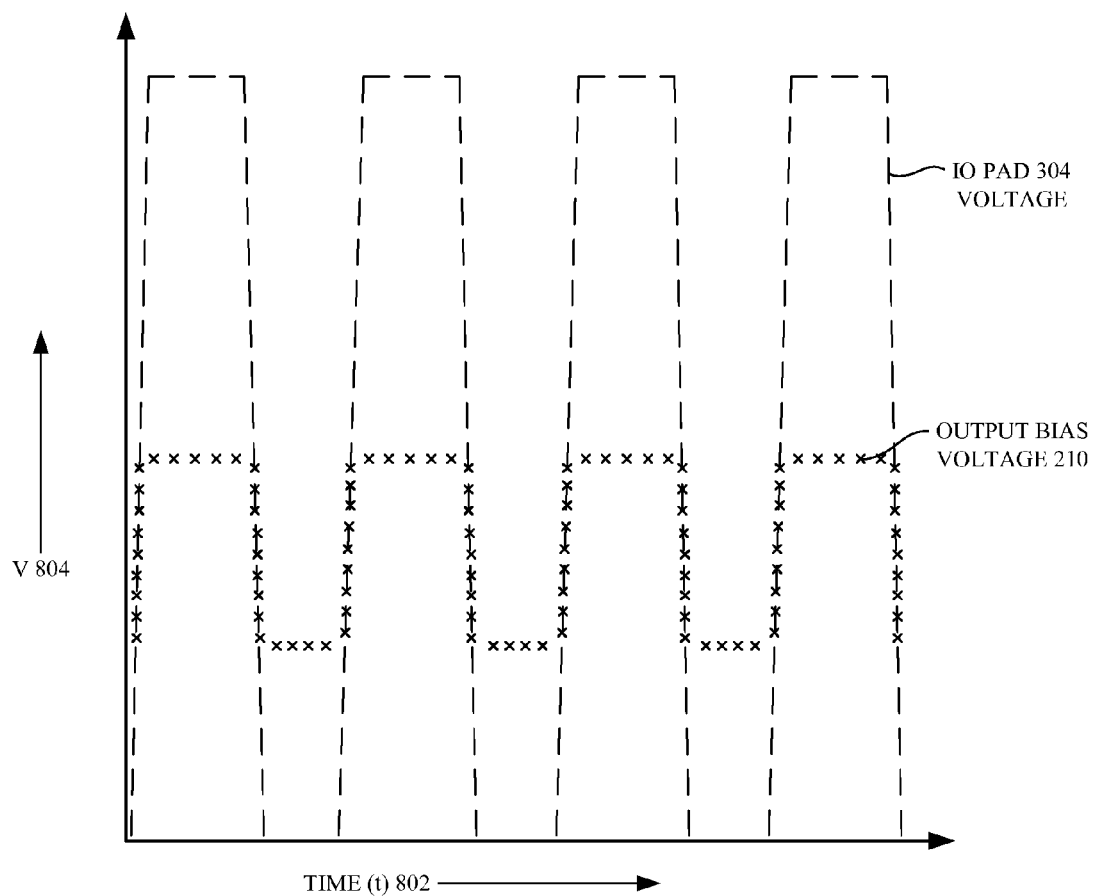
FIG. 8 is a plot of the transient characteristics of the transistor implementation of the multiplexer circuit of FIG. 2 during the tolerant mode of operation, according to one or more embodiments.

FIG. 8 shows the transient characteristics of the transistor implementation 300 of the multiplexer circuit 200 of FIG. 2 during the tolerant mode of operation, according to one or more embodiments. In one or more embodiments, the x-axis 802 may refer to time (t) and the y-axis 804 may refer to a voltage variable (V). In one or more embodiments, as the IO pad 304 voltage switches from 0 to a maximum value thereof (e.g., 3.465 V) and from the maximum value to 0, the output bias voltage 210 may switch between two voltages, i.e., one close to the first bias voltage 206 and the other close to the second bias voltage 208, and vice versa.

Figure 9:
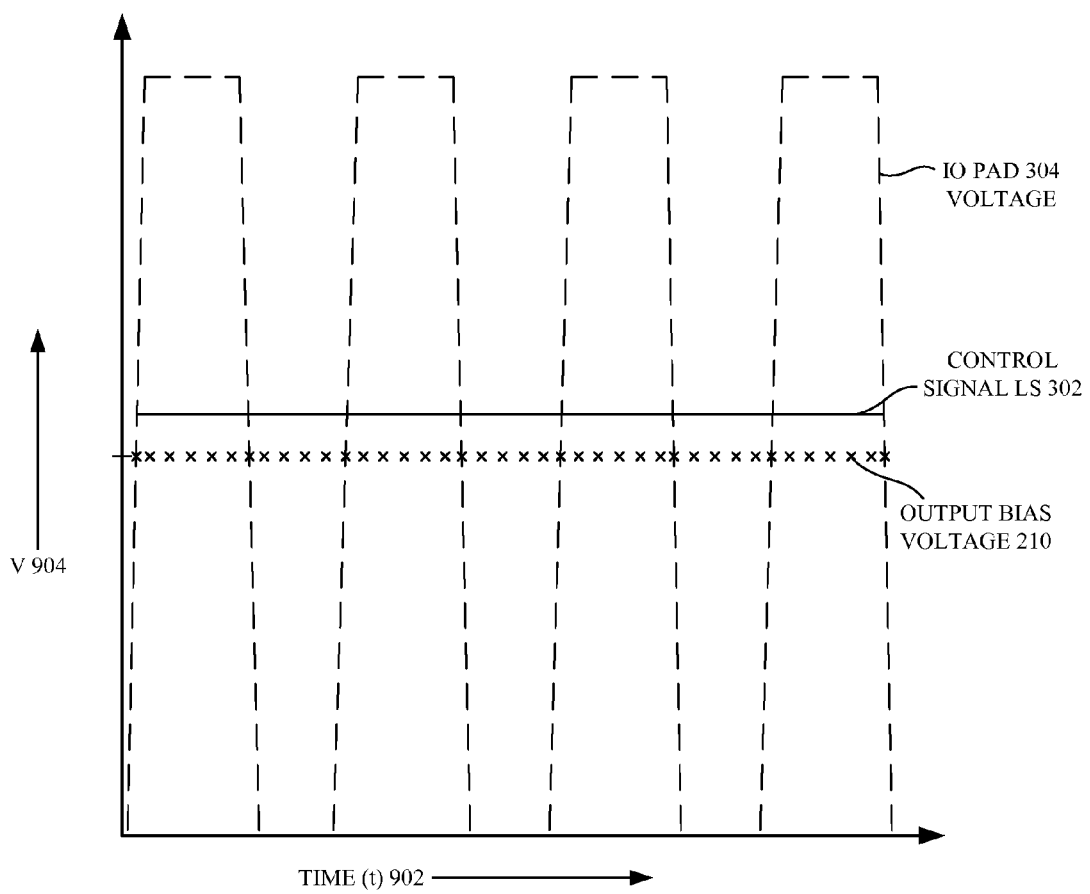
FIG. 9 is a plot of the transient characteristics of the transistor implementation of the multiplexer circuit of FIG. 2 during the driver mode of operation, according to one or more embodiments.

FIG. 9 shows the transient characteristics of the transistor implementation 300 of the multiplexer circuit 200 of FIG. 2 during the driver mode of operation, according to one or more embodiments. In one or more embodiments, the x-axis 902 may refer to time (t) and the y-axis 904 may refer to a voltage variable (V). In one or more embodiments, the IO pad 304 voltage may vary from 0 to the value of the supply voltage $V_{DDIO}$ during the driver mode of operation. In one or more embodiments, as the pad 304 voltage switches between 0 and a maximum value thereof (e.g., $V_{DDIO}$ of 2.75 V), the output bias voltage 210 may be constant at the value of the first bias voltage 206 (e.g., 0.55 $V_{DDIO}$). In one or more embodiments, control signal LS 302 may also be a fraction of the supply voltage $V_{DDIO}$ (e.g., 0.6 $V_{DDIO}$).

Figure 10:
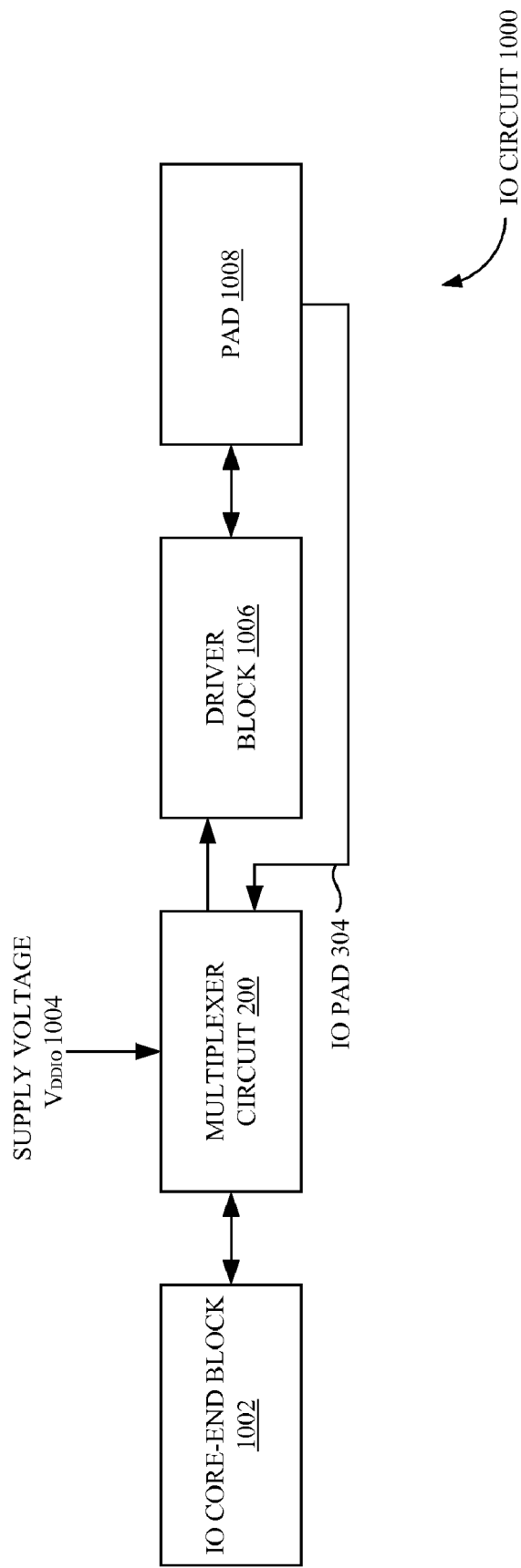
FIG. 10 is a system view of an Input/Output (IO) circuit, according to one or more embodiments.

FIG. 10 shows a system view of an IO circuit 1000, according to one or more embodiments. In one or more embodiments, the 10 circuit 1000 may include a driver block 1006 to drive external active circuit elements (e.g., MOS transistors) that may be interfaced with the IO core-end block 1002 through the multiplexer circuit 200 of FIG. 2. In one or more embodiments, the IO core-end block 1002 may include one or more constituent active circuit element(s) (e.g., MOS transistors) that have an upper tolerable limit of an operating voltage thereof (e.g., 1.98 V, 1.8 V+10% tolerance). In one or more embodiments, the control signal 204 may be generated by the IO core-end block 1002. In one or more embodiments, the multiplexer circuit 200 may receive the supply voltage ($V_{DDIO}$) 1004 and the external voltage supplied through an IO pad (shown as PAD 1008), IO pad 304 voltage, as shown in FIG. 10. In one or more embodiments, PAD 1008 may be interfaced with the driver block 1006. In one or more embodiments, the multiplexer circuit 200 may generate an output bias voltage 210 that may be within the upper tolerable limit of the operating voltage of the one or more constituent active circuit element(s) of the IO core-end block 1002.

Figure 11:
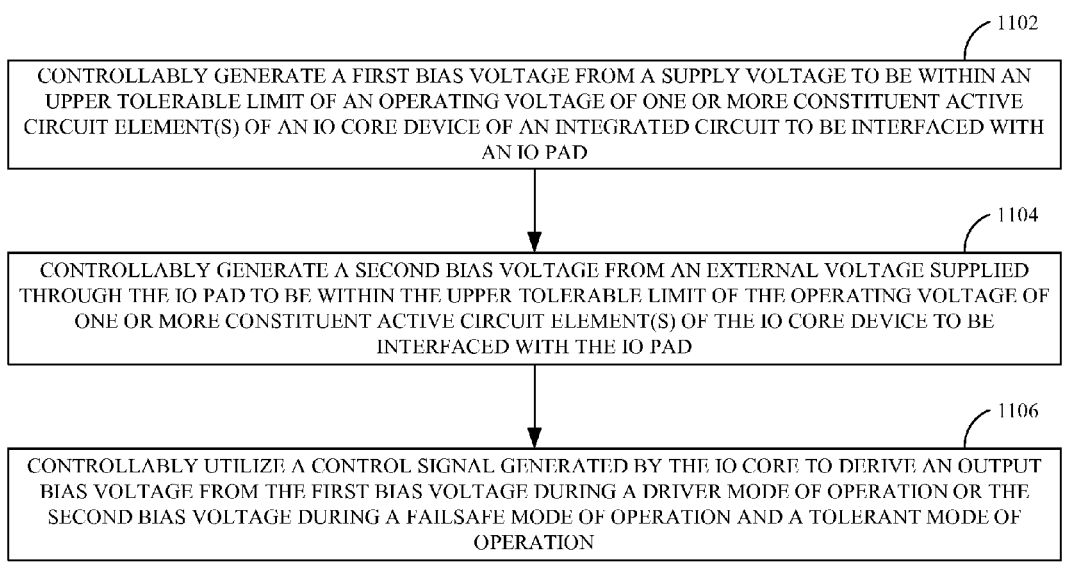
FIG. 11 is a process flow detailing the operations involved in a method of generating an output bias voltage, according to one or more embodiments.

FIG. 11 is a process flow diagram detailing the operations involved in a method of generating the output bias voltage 210, according to one or more embodiments. In one or more embodiments, operation 1102 may involve controllably generating a first bias voltage 206 from a supply voltage $V_{DDIO}$ 1004 to be within the upper tolerable limit of the operating voltage of one or more constituent active circuit element(s) of the IO core-end block 1002. In one or more embodiments, the IO core-end block 1002 may be an IO device of an integrated circuit (IC) to be interfaced with an IO pad (PAD 1008). In one or more embodiments, operation 1104 may involve controllably generating a second bias voltage 208 from the external voltage supplied through the IO pad (PAD 1008), IO pad 304 voltage, to be within the upper tolerable limit of the operating voltage of one or more constituent active circuit element(s) of the IO core-end block 1002.

In one or more embodiments, operation 1106 may involve controllably utilizing the control signal 204 generated by the IO core-end block 1002 to derive an output bias voltage 210 from the first bias voltage 206 during a driver mode of operation or the second bias voltage 208 during a failsafe mode of operation and a tolerant mode of operation. In one or more embodiments, the external voltage supplied through the IO pad (PAD 1008), IO pad 304 voltage, may vary from zero to a value of the supply voltage $V_{DDIO}$ 1004 during the driver mode of operation. In one or more embodiments, the supply voltage $V_{DDIO}$ 1004 may be zero during the failsafe mode of operation, and the external voltage supplied through the IO pad (PAD 1008), IO pad 304 voltage, may increase to a value above the supply voltage $V_{DDIO}$ 1004 during the tolerant mode of operation.

Although the present embodiments have been described with reference to specific example embodiments, it will be evident that various modifications and changes may be made to these embodiments without departing from the broader spirit and scope of the various embodiments. For example, variations in operating voltages and/or external voltages are within the scope of the exemplary embodiments. Also, for example, the various devices and modules described herein may be enabled and operated using hardware circuitry (e.g., CMOS based logic circuitry), firmware, software or any combination of hardware, firmware, and software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

In addition, it will be appreciated that the various operations, processes, and methods disclosed herein may be embodied in a machine-readable medium and/or a machine accessible medium compatible with a data processing system (e.g., a computer devices), and may be performed in any order (e.g., including using means for achieving the various operations). Accordingly, the specification and drawings are to be regarded in an illustrative rather than a restrictive sense.

What is claimed is:

1. An IO circuit comprising:
   an IO core-end block to generate a control signal, the IO core-end block comprising at least one constituent active circuit element having an upper tolerable limit of an operating voltage thereof;
   a driver block to drive at least one external active circuit element;
   an IO pad interfaced with the driver block; and
   a bias voltage generating circuit:
      to receive a supply voltage,
      to receive an external voltage supplied through the IO pad, and
      to generate an output bias voltage within the upper tolerable limit of the operating voltage of the at least one constituent active circuit element of the IO core-end block,
   wherein the bias voltage generating circuit comprises:
      a multiplexer block configured:
         to receive a first bias voltage controllably generated from the supply voltage to be within the upper tolerable limit of the operating voltage of the at least one constituent active circuit element of the IO core-end block to be interfaced with the IO pad,
         to receive a second bias voltage controllably generated from the external voltage supplied through the IO pad to be within the upper tolerable limit of the operating voltage of the at least one constituent active circuit element of the IO core-end block to be interfaced with the IO pad, and
         to derive the output bias voltage from one of the first bias voltage during a driver mode of operation and the second bias voltage during a failsafe mode of operation and a tolerant mode of operation through a controllable utilization of the control signal generated by the IO core-end block,
      wherein the external voltage supplied through the IO pad varies from zero to a value of the supply voltage during the driver mode of operation,
      wherein the supply voltage is zero during the failsafe mode of operation, and wherein the external voltage supplied through the IO pad increases to a value above the supply voltage during the tolerant mode of operation.

2. The IO circuit of claim 1, wherein:
the first bias voltage is a controllable fraction of the supply voltage, and
the second bias voltage is equal to the external voltage supplied through the IO pad reduced by a threshold voltage of at least one active circuit element.

3. The bias voltage generating circuit of claim 1, wherein the multiplexer block comprises:
a first MOS transistor configured to receive the first bias voltage at one of a source terminal and a drain terminal thereof;
a second MOS transistor configured to receive the second bias voltage at one of a source terminal and a drain terminal thereof; and
a third MOS transistor configured to receive a controllable voltage representation of the control signal at a gate terminal thereof,
wherein a gate terminal of the second MOS transistor is configured to receive the controllable voltage representation of the control signal,
wherein the one of the source terminal and the drain terminal of the first MOS transistor not configured to receive the first bias voltage is configured to be coupled to the one of the source terminal and the drain terminal of the second MOS transistor not configured to receive the second bias voltage,
wherein one of a source terminal and a drain terminal of the third MOS transistor is configured to be coupled to a gate terminal of the first MOS transistor,
wherein the other of the source terminal and the drain terminal of the third MOS transistor is configured to be coupled to the one of the source terminal and the drain terminal of the second MOS transistor configured to receive the second bias voltage, and
wherein the output bias voltage is configured to be output at a path coupling the one of the source terminal and the drain terminal of the first MOS transistor not configured to receive the first bias voltage to the one of the source terminal and the drain terminal of the second MOS transistor not configured to receive the second bias voltage.

4. A method comprising:
controllably generating a first bias voltage from a supply voltage to be within an upper tolerable limit of an operating voltage of at least one constituent active circuit element of an Input/Output (IO) core device of an integrated circuit (IC) to be interfaced with an IO pad;
controllably generating a second bias voltage from an external voltage supplied through the IO pad to be within the upper tolerable limit of the operating voltage of the at least one constituent active circuit element of the IO core device to be interfaced with the IO pad; and
controllably utilizing a control signal generated by the IO core to derive an output bias voltage from one of the first bias voltage during a driver mode of operation and the second bias voltage during a failsafe mode of operation and a tolerant mode of operation,
wherein the external voltage supplied through the IO pad varies from zero to a value of the supply voltage during the driver mode of operation,
wherein the supply voltage is zero during the failsafe mode of operation, and
wherein the external voltage supplied through the IO pad increases to a value above the supply voltage during the tolerant mode of operation.

5. The method of claim 4, comprising controllably generating a fraction of the supply voltage as the first bias voltage.

6. The method of claim 4, comprising multiplexing the first bias voltage and the second bias voltage to derive the output bias voltage based on a corresponding low value state and a high value state of the control signal.

7. The method of claim 6, wherein multiplexing the first bias voltage and the second bias voltage further comprises:
receiving the first bias voltage at one of a source terminal and a drain terminal of a first MOS transistor;
receiving the second bias voltage at one of a source terminal and a drain terminal of a second MOS transistor;
receiving a controllable voltage representation of the control signal at a gate terminal of each of the second MOS transistor and a third MOS transistor;
coupling the one of the source terminal and the drain terminal of the first MOS transistor not receiving the first bias voltage to the one of the source terminal and the drain terminal of the second MOS transistor not receiving the second bias voltage;
coupling one of a source terminal and a drain terminal of the third MOS transistor to a gate terminal of the first MOS transistor;
coupling the other of the source terminal and the drain terminal of the third MOS transistor to the one of the source terminal and the drain terminal of the second MOS transistor receiving the second bias voltage; and
outputting the output bias voltage at a path coupling the one of the source terminal and the drain terminal of the first MOS transistor not receiving the first bias voltage to the one of the source terminal and the drain terminal of the second MOS transistor not receiving the second bias voltage.

8. The method of claim 4, comprising controllably generating the second bias voltage by reducing the external voltage supplied through the IO pad by a threshold voltage of at least one active circuit element.

9. The method of claim 8, further comprising regulating the second bias voltage through controlling a voltage drop across the at least one active circuit element using another active circuit element.

10. The method of claim 9, further comprising providing a pass transistor path comprising:
a first pass MOS transistor configured to receive the control signal at a gate terminal thereof; and
a second pass MOS transistor configured to receive the first bias voltage at a gate terminal thereof,
wherein one of a source terminal and a drain terminal of the first pass MOS transistor, a bulk terminal of the first pass MOS transistor, and a bulk terminal of the second pass MOS transistor are configured to be held at a second supply voltage level,
wherein one of a source terminal and a drain terminal of the second pass MOS transistor is configured to be coupled to the gate terminal of the first MOS transistor, and
wherein the one of the source terminal and the drain terminal of the first pass MOS transistor not configured to be held at the second supply voltage level is configured to be coupled to the one of the source terminal and the drain terminal of the second pass MOS transistor not configured to be coupled to the gate terminal of the first MOS transistor.

11. The method of claim 9, further comprising decoupling a capacitive noise from the output bias voltage during application of the output bias voltage to a driver of the IO pad.

12. The method of claim 9, further comprising applying an output of a floating well (FW) circuit to a bulk terminal of each of the first MOS transistor, the second MOS transistor, and the third MOS transistor.

13. A bias voltage generating circuit comprising:
a multiplexer block configured:
to receive a first bias voltage controllably generated from a supply voltage to be within an upper tolerable limit of an operating voltage of at least one constituent active circuit element of an IO core device of an IC to be interfaced with an IO pad,
to receive a second bias voltage controllably generated from an external voltage supplied through the IO pad to be within the upper tolerable limit of the operating voltage of the at least one constituent active circuit element of the IO core device to be interfaced with the IO pad, and
to derive an output bias voltage from one of the first bias voltage during a driver mode of operation and the second bias voltage during a failsafe mode of operation and a tolerant mode of operation through a controllable utilization of a control signal generated by the IO core,
wherein the external voltage supplied through the IO pad varies from zero to a value of the supply voltage during the driver mode of operation,
wherein the supply voltage is zero during the failsafe mode of operation, and
wherein the external voltage supplied through the IO pad increases to a value above the supply voltage during the tolerant mode of operation.

14. The bias voltage generating circuit of claim 13, wherein:
the first bias voltage is a controllable fraction of the supply voltage, and
the second bias voltage is equal to the external voltage supplied through the IO pad reduced by a threshold voltage of at least one active circuit element.

15. The bias voltage generating circuit of claim 14, further comprising another active circuit element to regulate the second bias voltage through a control of a voltage drop across the at least one active circuit element.

16. The bias voltage generating circuit of claim 13, wherein the output bias voltage is derived based on a corresponding low value state and a high value state of the control signal.

17. The bias voltage generating circuit of claim 16, wherein an output of a FW circuit is configured to be applied to a bulk terminal of each of the first MOS transistor, the second MOS transistor, and the third MOS transistor.

18. The bias voltage generating circuit of claim 16, wherein the multiplexer block comprises:
a first MOS transistor configured to receive the first bias voltage at one of a source terminal and a drain terminal thereof;
a second MOS transistor configured to receive the second bias voltage at one of a source terminal and a drain terminal thereof; and
a third MOS transistor configured to receive a controllable voltage representation of the control signal at a gate terminal thereof,
wherein a gate terminal of the second MOS transistor is configured to receive the controllable voltage representation of the control signal,
wherein the one of the source terminal and the drain terminal of the first MOS transistor not configured to receive the first bias voltage is configured to be coupled to the one of the source terminal and the drain terminal of the second MOS transistor not configured to receive the second bias voltage,
wherein one of a source terminal and a drain terminal of the third MOS transistor is configured to be coupled to a gate terminal of the first MOS transistor,
wherein the other of the source terminal and the drain terminal of the third MOS transistor is configured to be coupled to the one of the source terminal and the drain terminal of the second MOS transistor configured to receive the second bias voltage, and
wherein the output bias voltage is configured to be output at a path coupling the one of the source terminal and the drain terminal of the first MOS transistor not configured to receive the first bias voltage to the one of the source terminal and the drain terminal of the second MOS transistor not configured to receive the second bias voltage.

19. The bias voltage generating circuit of claim 16, further comprising a pass transistor path comprising:
a first pass MOS transistor configured to receive the control signal at a gate terminal thereof; and
a second pass MOS transistor configured to receive the first bias voltage at a gate terminal thereof,
wherein one of a source terminal and a drain terminal of the first pass MOS transistor, a bulk terminal of the first pass MOS transistor, and a bulk terminal of the second pass MOS transistor are configured to be held at a second supply voltage level,
wherein one of a source terminal and a drain terminal of the second pass MOS transistor is configured to be coupled to the gate terminal of the first MOS transistor, and
wherein the one of the source terminal and the drain terminal of the first pass MOS transistor not configured to be held at the second supply voltage level is configured to be coupled to the one of the source terminal and the drain terminal of the second pass MOS transistor not configured to be coupled to the gate terminal of the first MOS transistor.

20. The bias voltage generating circuit of claim 16, further comprising a decoupling capacitor to decouple a capacitive noise from the output bias voltage during application of the output bias voltage to a driver of the IO pad.

21. The bias voltage generating circuit of claim 20, wherein the decoupling capacitor is an n-channel MOS (NMOS) capacitor.

* * * * *